United States Patent [19]
Hidaka

[11] Patent Number: 5,953,063
[45] Date of Patent: Sep. 14, 1999

[54] BI-PHASE CODE DECODING SYSTEM

[75] Inventor: Kenji Hidaka, Tokyo, Japan

[73] Assignee: NEC Corporation, Tokyo, Japan

[21] Appl. No.: 08/859,175

[22] Filed: May 20, 1997

[30] Foreign Application Priority Data

May 20, 1996 [JP] Japan .................................. 8-124288

[51] Int. Cl.[6] .................................................. H04N 7/24
[52] U.S. Cl. ........................... 348/384; 386/33; 386/112; 341/70; 375/333
[58] Field of Search ................................. 348/384, 390; 382/232, 233; 386/33, 40, 112, 124, 125, 126; 360/48; 369/124; 341/70, 71; 375/282, 333, 361

[56] References Cited

U.S. PATENT DOCUMENTS

| 5,185,766 | 2/1993 | Cho | 375/333 |
| 5,617,392 | 4/1997 | Shim | 369/50 |

FOREIGN PATENT DOCUMENTS

| 61-156922 | 7/1986 | Japan . |
| 63-30026 | 2/1988 | Japan . |
| 63-52521 | 3/1988 | Japan . |

Primary Examiner—Bryan Tung
Attorney, Agent, or Firm—Scully, Scott, Murphy & Presser

[57] ABSTRACT

A horizontal period counter 3 determines one bit period of bi-phase codes by measuring the period of a horizontal scan line immediately preceding one containing bi-phase codes to be decoded. An edge pulse generator 6 generates edge pulses at rising and falling edges of inputted bi-phase codes. A compensating pulse generator 7 is triggered by the edge pulse and generates a compensating pulse in a predetermined period, which is shorter than one bit period of the bi-phase codes and longer than one half bit period, according to one bit period that has been determined. A rise judging circuit 11 generates sampling pulses by superimposing compensating pulses on the edge pulses. The bi-phase codes are decoded according to the sampling pulses.

5 Claims, 3 Drawing Sheets

BI-PHASE CODE DECODING SYSTEM

BACKGROUND OF THE INVENTION

The present invention relates to bi-phase code decoding systems for decoding bi-phase codes contained in video signals and, more particularly, to bi-phase code systems which can reliably decode bi-phase codes contained in video signals even when the speed or rotation of a laser disc (LD) is unstable.

FIG. 3 shows a bi-phase code decoding system of the pertaining type. A motor control circuit 31 of a laser disc player (hereinafter referred to as LDP) makes a control for stabilizing the rotation of a laser disc (hereinafter referred to as LD). After an LD servo circuit 32 outputs a stable rotation signal by detecting that the rotation of the LD has been stabilized, the bi-phase code is decoded by sampling data. The system includes an LD data reader 33, a horizontal sync counter 34, and a bi-phase code decoder 35. The bi-phase code decoder 35 extracts the decoded code.

The LD data reader 33 reads out the LD data, and supplies the read-out horizontal sync signal (HSYNC) and vertical sync signal (VSYNC) to the horizontal sync counter 34 and the video signal to a bi-phase code decoder 35. The horizontal sync counter 34 receives the horizontal and vertical sync signals and counts the horizontal sync signal. The horizontal sync counter 34 outputs a decoding start signal to the bi-phase code decoder 35 when the horizontal sync signals are horizontal scan lines including a bi-phase code.

The bi-phase code decoder 35 receives the decoding start signal from the horizontal sync counter 34 and outputs sampling data which is obtained by the sampling in synchronism with the horizontal and vertical sync signals and a clock signal at a higher frequency than the frequency of the bi-phase code.

As shown in FIG. 4, rise and fall edges of the bi-phase code data are judged. When the code data edge is the rise edge, it is decoded as "1". When it is the fall edge, it is decoded as "0". When the same data is judged continuously, dummy data between adjacent edges of the intrinsic data are also continuous. Therefore, a deviation of the sampling timing due to unstable rotation of the LD, would result in sampling of a dummy edge.

As shown above, the prior art bi-phase code decoding system has a problem that a deviation of the sampling timing due to unstable LD rotation may give rise to an opportunity of sampling a dummy edge, resulting in erroneous judgment or failure of the judgment.

SUMMARY OF THE INVENTION

An object of the present invention is therefore to provide a bi-phase code decoder capable of reliable decoding of bi-phase codes contained in a video signal even when the LD rotation speed is unstable.

According to an aspect of the present invention, there is provided a bi-phase code decoding system for decoding bi-phase codes contained in a video signal, comprising: determining one bit period of input bi-phase by measuring a period of one input horizontal scan line; generating edge pulses at the rising and falling edges of the input bi-phase code; generating a compensation pulse triggered by the edge pulse on the basis of the determined bit period in a predetermined period, which is shorter than the bit period and longer than one half thereof; generating a sampling pulse by superimposing the compensating pulse on the edge pulses, and decoding the bi-phase code from the video signal on the basis of the generated sampling pulses.

The one bit period of the horizontal scan line to be measured is immediately preceding the one which contains a bit-phase code to be decoded.

According to another aspect of the present invention, there is provided a bi-phase code decoding system for decoding bi-phase codes contained in a video signal comprising: a clock generator for generating a drive clock signal containing a number of clock pulses at a sufficiently short pulse interval in one horizontal scan period of a horizontal synchronizing signal synchronized with the inputted bi-phase codes; a horizontal period counter for counting one period of the horizontal synchronizing signal according to the drive clock signal; an edge pulse generator for generating edge pulses at rising and falling edges of the inputted bi-phase codes; a compensating pulse generator, triggered by the edge pulse generated from the edge generator, for generating a compensating pulse in a predetermined period, which is shorter than one bit period of the bi-phase codes and longer than one half bit period thereof, on the basis of the count output of the horizontal period counter; and a rise judging circuit for generating a sampling pulse at the rising of a waveform obtained by superimposing the compensating pulse output of the compensating pulse generator to the edge pulse output of the edge pulse generator and frequency dividing the result of the superimposition to one half, the bi-phase codes being decoded from the video signal according to the sampling signal output of the rise judging circuit.

The bi-phase code decoding system further comprises a horizontal scan counter for outputting data representing a horizontal scan line immediately preceding the one, bi-phase codes of which are to be decoded, by counting horizontal scan lines according to received horizontal and vertical synchronizing signals, the horizontal period counter and the edge pulse generator being caused to start operation when they receive the output of the horizontal scan line counter.

The bi-phase code decoding system further comprises a multiplier for multiplying the count of said horizontal period counter and preliminarily stored ratio data between the period of the intrinsic horizontal scan line and the period of one bit of the intrinsic bi-phase codes, thereby generating a drive clock interval which is shorter than one bit period of the bi-phase codes and longer than one half bit period, the compensating pulse generator being operable to drive the horizontal period counter and receive the output therefrom upon reception of an edge pulse from the edge pulse generator and generate a compensating pulse upon reaching of the drive clock interval of the multiplier.

In this system, no edge pulse is generated in a predetermined period longer than one half bit period of the bi-phase code, and the next data edge is judged to be an intrinsic data edge to add a compensating pulse at a timing, which is beyond one bit period of the bi-phase code and does not spoil an edge pulse generated by the next data edge. One bit period that is used is obtained by measuring the period of the horizontal scan period immediately preceding the input horizontal scan period. It is thus possible to ensure reliable compensating pulse addition even before the stabilization of the LD rotation speed.

Other objects and features will be clarified from the following description with reference to attached drawings.

PREFERRED EMBODIMENTS OF THE INVENTION

Figure 1:
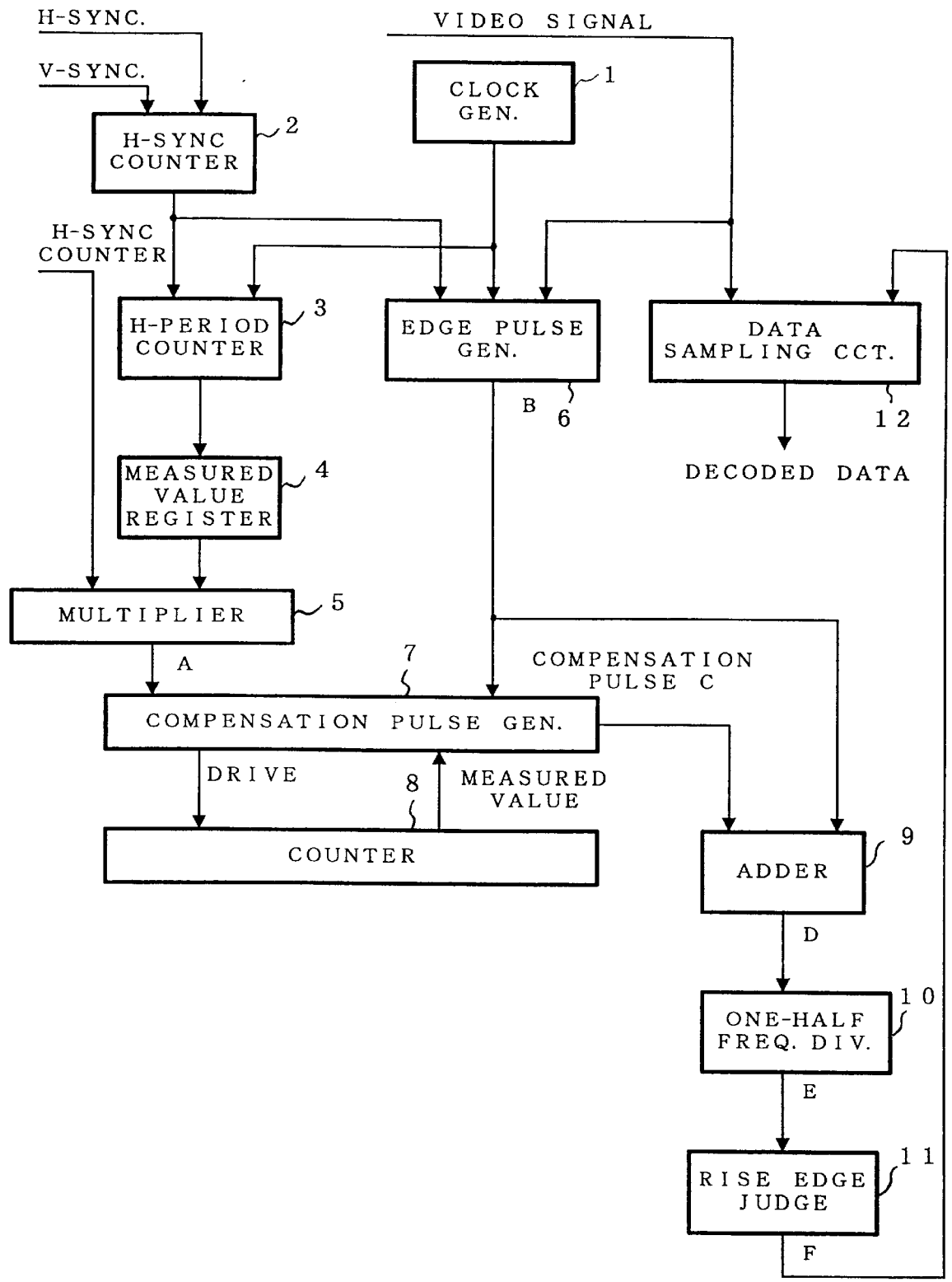
FIG. 1 is a block diagram showing an embodiment of the present invention.

FIG. 1 is a block diagram showing an embodiment of the present invention. In the bi-phase code decoder system shown in FIG. 1, it is assumed that sampling pulses which are generated through a clock generator 1, a horizontal sync counter 2, a horizontal period counter 3, a measurement value register 4, a multiplier 5, an edge pulse generator 6, a compensating pulse generator 7, a counter 8, an adder 9, a one-half frequency divider 10, and a rise edge judging circuit 11, are coupled to a data sampling circuit 12.

This circuit construction is different from the prior art in that when a bi-phase code is changed, it is judged that no dummy edge is present between adjacent intrinsic data edges obtained form the input data, and a compensating pulse is generated and inserted in the space between adjacent edge pulses obtained from the input data, whereby pulses at every other intrinsic data edge positions are outputted as sampling pulses.

The components of the decoder system shown in FIG. 1 will now be described.

The clock generator 1 generates a drive clock signal, which has a number of pulses with a sufficiently short pulse interval compared to one horizontal scan period of a horizontal sync signal synchronized with an input pulse code, and provides the drive clock pulse thus generated to the horizontal period counter 3 and the edge pulse generator 6. The horizontal sync counter 2 receives a horizontal and a vertical sync signals outputted from an LD, obtains the line number of the prevailing horizontal scan line by counting, and provides this line number to the horizontal period counter 3 and the edge pulse generator 6.

For the horizontal period counter 3, the line number of a horizontal scan line including a bi-phase code to be decoded is previously designated. When it receives a horizontal scan line of the preceding horizontal scan line, it starts counting of the clock pulses of the drive signal received from the clock generator 1. The counting is stopped when the next horizontal sync signal is inputted. The counted value thus obtained is a measure of the period of one horizontal scan line that is inputted. Thus, the horizontal scan line frequency is obtained and is stored as a measurement value representing the rotation speed of the LD in the measurement value register 4.

For the multiplier 5 ratio data representing the ratio between the cycle period of the intrinsic horizontal scan line and that of one bit of the intrinsic bi-phase code is previously set. The multiplier 5 multiplies the ratio data and the measurement value stored in the measurement value register 4 by each other, and provides the product thus obtained as a counter measurement value A (see FIG. 2), for generating a compensating pulse for one bit of the bi-phase code of the next horizontal scan line, to the compensating pulse generator 7. As a result, the counter measured value A is determined as the appropriate value for the LD rotation speed.

Figure 2:
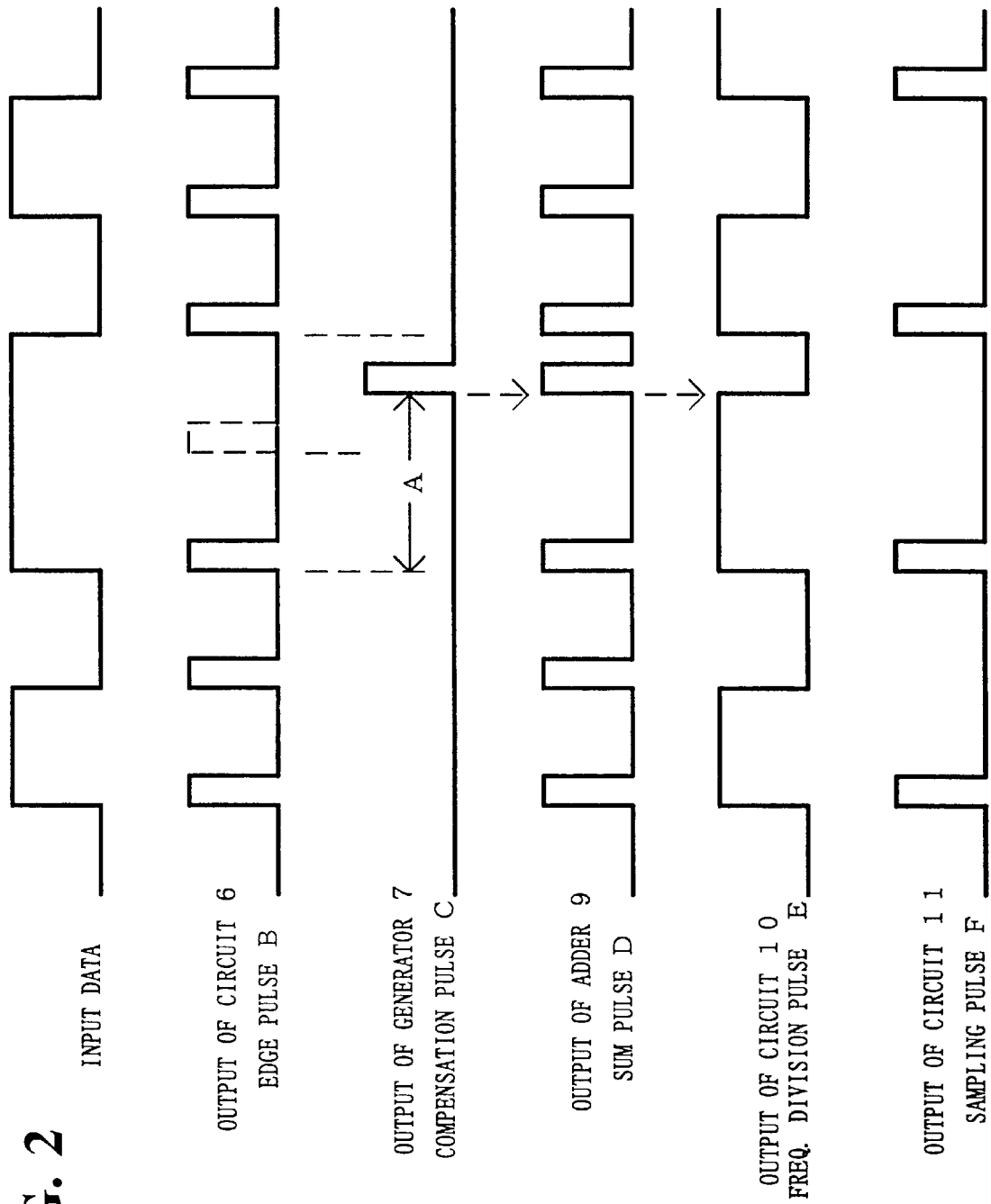
FIG. 2 shows waveform chart for explaining the embodiment in FIG. 1.
Figure 3:
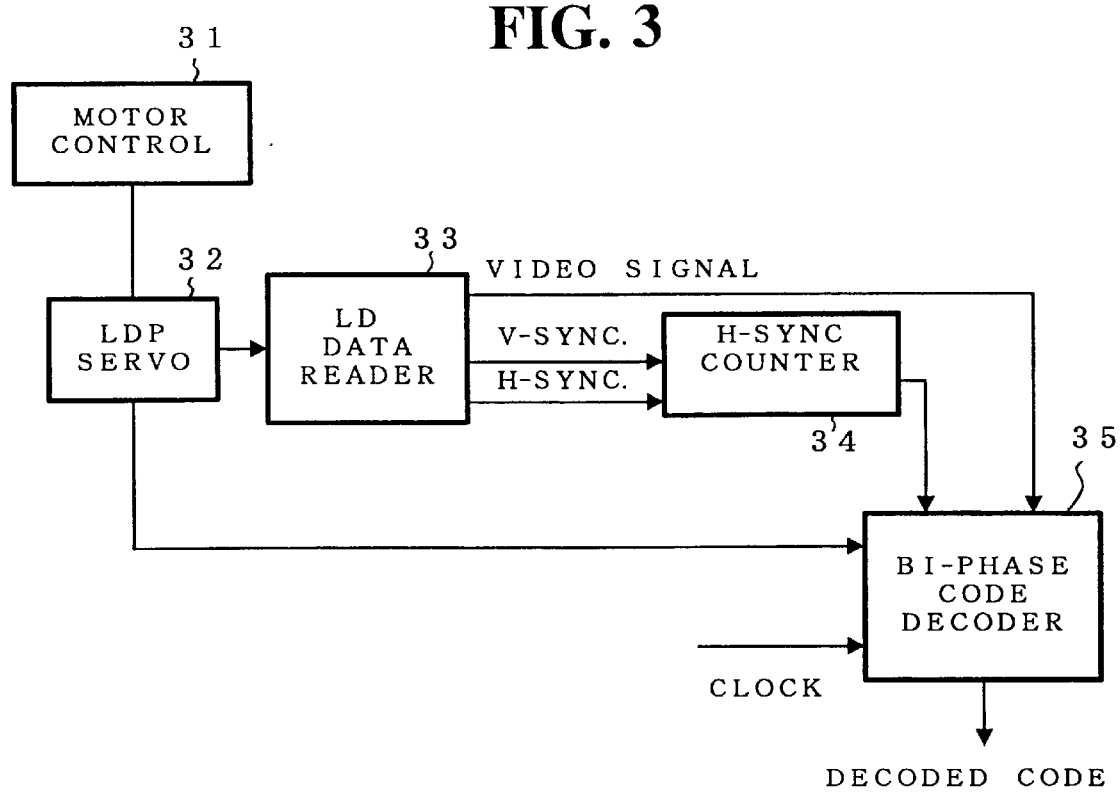
FIG. 3 shows a bi-phase code decoding system of the pertaining type.
Figure 4:
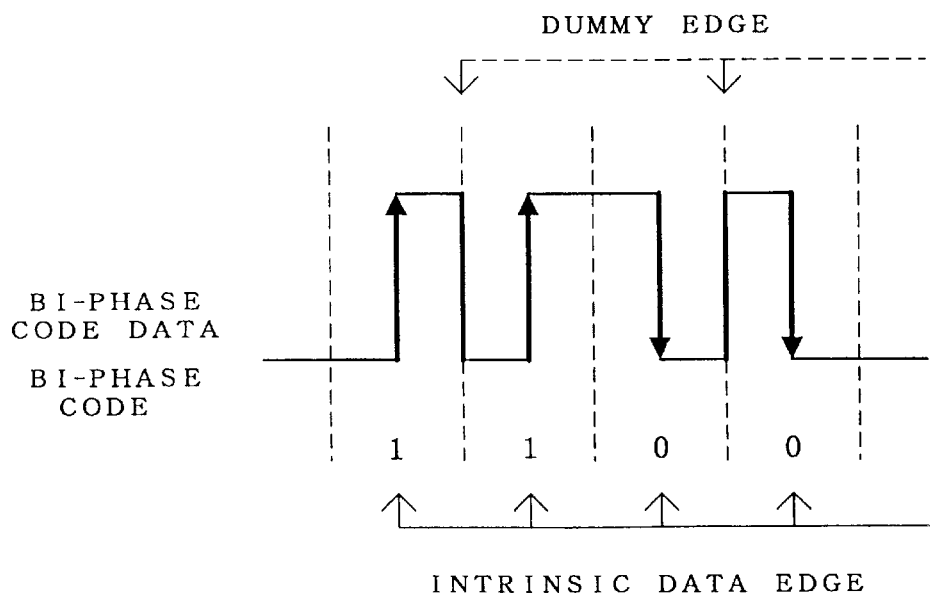
FIG. 4 shows waveforms for judging rise and fall edges of the bi-phase code data.

The description will now be described with reference to the waveform chart of FIG. 2 as well as FIG. 1.

The edge pulse generator 6 receives the video signal data including bi-phase code data, the drive clock signal from the clock generator 1 and the line number output of the horizontal period counter 2. When the edge pulse generator 6 receives line number concerning the bi-phase code to be decoded from the horizontal period counter 2 while receiving the video signal data, it starts sampling of data according to the pulses of the drive clock signal being received to judge both the rise and fall edges of the data and provide edge pulses B to the compensating pulse generator 7 and the adder 9.

When the compensating pulse generator 7 receives an edge pulse B from the edge pulse generator 6, it causes the counter 8 to start counting. In response to exceed of the counter measurement value A received from the multiplier 5 before receiving the next edge pulse B, the compensating pulse generator 7 outputs a compensating pulse C to the adder 9. When it receives the next edge pulse B before the counter measurement value A is exceeded, the compensating pulse generator 7 resets and restarts the counter 8 for counting from "0".

The compensating pulse generator 7 is a mono-stable multi-vibrator capable of being re-triggered for varying the time until generation of a compensating pulse C in proportion to the counter measurement value A.

The counter measurement value A provided by the multiplier 5 is such that a compensating pulse C is generated at a position, which is beyond the interval between the intrinsic data edge and a dummy data edge (i.e., one half the data edge interval), and at which an edge pulse B can be normally generated at the next dummy edge. The counter measurement value A thus may be numerically set to substantially three-fourth or substantially three-fifth of the data edge interval.

The adder 9 receives and adds together the edge pulses B of the edge pulse generator 6 and the compensating pulses C of the compensating pulse generator 7, and provides the sum pulses D to the one-half frequency divider 10. The one-half frequency divider 10 frequency divides the sum pulse output D by two and provides the resultant frequency division data E to the rise edge judging circuit 11. The rise edge judging circuit 11 detects the rises of the frequency division pulses E and provides sampling pulses F of bi-phase code data to the data sampling circuit 12.

The data sampling circuit 12 receives the video signal data, and samples the intrinsic data edges according to the sampling pulses F received from the rise judging circuit 11, thereby decoding the bi-phase code.

As described above, since the generation timing of compensation pulse is determined by the counted value according to LD rotation speed, the compensation pulse is generated at appropriate timing taking the rotation speed into account by predicting frequencies of the present horizontal scan line and the bi-phase code data from the horizontal scan frequency by the preceding horizontal synchronization signal even if LD rotation speed is unstable and the bi-phase code data frequency is unstable. As a result, there exists no dummy edge due to the change of the data code of bi-phase code between "0" and "1". Even in the case of unclear bit boundary the sampling pulse for the bi-phase code data is obtained by generating the compensation pulse of the dummy edge It will be understandable from the foregoing that since the generation timing of compensation pulse is determined by the counted value corresponding to LD rotation speed, the compensation pulse is generated at appropriate timing taking the rotation speed into account by predicting frequencies of the present horizontal scan line and the bi-phase code data on the basis of the horizontal scan frequency of the preceding horizontal synchronization signal even if LD rotation speed is unstable and the bi-phase code data frequency is unstable. As a result, there exists no dummy edge due to the change of data code of bi-phase code between "0" and "1". Even in the case of unclear bit boundary, the sampling pulse for the bi-phase code data is obtained by generating the compensation pulse of the dummy edge and one-half frequency division with two pulses for one bit of bi-phase code data.

While the above description has been made with reference to the functional block illustration, it is possible to freely change the construction and function by separating or uniting functions so long as the above function is met, and the above description does not limit the present invention.

As has been described in the foregoing, in the system according to the present invention, one bit period of input bi-phase is determined by measuring a period of one input horizontal scan line, edge pulses are generated at the rising and falling edges of the input bi-phase code, a compensation pulse is generated on the basis of the determined bit period in a predetermined period, which is shorter than the bit period and longer than one half thereof. A sampling pulse is generated by superimposing the compensating pulse on the edge pulses, and the bi-phase code from the video signal is decoded on the basis of the generated sampling pulses.

In this system, no edge pulse is generated in a predetermined period longer than one half bit period of the bi-phase code, the next data edge is judged to be an intrinsic data edge, and a compensating pulse can be added at a timing, which is beyond one bit period of the bi-phase code and does not spoil an edge pulse generated by the next data edge. It is thus possible to obtain reliable sampling pulses.

In addition, since one period the horizontal scan line to be measured is immediately preceding the one containing bi-phase code to be decoded, reliable decoding of bi-phase code in the video signal can be obtained even when the LD rotation speed is unstable.

Changes in construction will occur to those skilled in the art and various apparently different modifications and embodiments may be made without departing from the scope of the present invention. The matter set forth in the foregoing description and accompanying drawings is offered by way of illustration only. It is therefore intended that the foregoing description be regarded as illustrative rather than limiting.

What is claimed is:

1. A bi-phase code decoding system for decoding bi-phase codes contained in a video signal, comprising:

determining one bit period of input bi-phase by measuring a period of one input horizontal scan line;

generating edge pulses at the rising and falling edges of the input bi-phase code;

generating a compensation pulse triggered by the edge pulse on the basis of the determined bit period in a predetermined period, which is shorter than the bit period and longer than one half thereof;

generating a sampling pulse by superimposing the compensating pulse on the edge pulses; and decoding the bi-phase code from the video signal on the basis of the generated sampling pulses.

2. The bi-phase code decoding system according to claim 1, wherein the one bit period of the horizontal scan line to be measured is immediately preceding the one which contains a bit-phase code to be decoded.

3. A bi-phase code decoding system for decoding bi-phase codes contained in a video signal comprising:

a clock generator for generating a drive clock signal containing a number of clock pulses at a sufficiently short pulse interval in one horizontal scan period of a horizontal synchronizing signal synchronized with the inputted bi-phase codes;

a horizontal period counter for counting one period of the horizontal synchronizing signal according to the drive clock signal;

an edge pulse generator for generating edge pulses at rising and falling edges of the inputted bi-phase codes;

a compensating pulse generator, triggered by the edge pulse generated from the edge generator, for generating a compensating pulse in a predetermined period, which is shorter than one bit period of the bi-phase codes and longer than one half bit period thereof, on the basis of the count output of the horizontal period counter; and a rise judging circuit for generating a sampling pulse at the rising of a waveform obtained by superimposing the compensating pulse output of the compensating pulse generator to the edge pulse output of the edge pulse generator and frequency dividing the result of the superimposition to one half, the bi-phase codes being decoded from the video signal according to the sampling signal output of the rise judging circuit.

4. The bi-phase code decoding system according to claim 3, which further comprises a horizontal scan counter for outputting data representing a horizontal scan line immediately preceding the one, bi-phase codes of which are to be decoded, by counting horizontal scan lines according to received horizontal and vertical synchronizing signals, the horizontal period counter and the edge pulse generator being caused to start operation when they receive the output of the horizontal scan line counter.

5. The bi-phase code decoding system according to claim 3, which further comprises a multiplier for multiplying the count of said horizontal period counter and preliminarily stored ratio data between the period of the intrinsic horizontal scan line and the period of one bit of the intrinsic bi-phase codes, thereby generating a drive clock interval which is shorter than one bit period of the bi-phase codes and longer than one half bit period, the compensating pulse generator being operable to drive the horizontal period counter and receive the output therefrom upon reception of an edge pulse from the edge pulse generator and generate a compensating pulse upon reaching of the drive clock interval of the multiplier.

* * * * *